United States Patent [19]

Nyul

[11] 4,167,744
[45] Sep. 11, 1979

[54] ELECTROLUMINESCENT SEMICONDUCTOR DEVICE HAVING OPTICAL FIBER WINDOW

[75] Inventor: Paul Nyul, New Holland, Pa.

[73] Assignee: RCA Corporation, New York, N.Y.

[21] Appl. No.: 889,354

[22] Filed: Mar. 23, 1978

[51] Int. Cl.² .................................... H01L 27/14
[52] U.S. Cl. .................................. 357/17; 357/74; 350/96.20
[58] Field of Search .................. 357/74, 17, 18; 350/96.20

[56] References Cited

U.S. PATENT DOCUMENTS

| | | | |
|---|---|---|---|
| 3,869,702 | 3/1975 | Backhouse | 357/74 |
| 4,007,477 | 2/1977 | Goodman | 357/81 |
| 4,119,363 | 10/1978 | Camlibel | 350/96.20 |

Primary Examiner—Martin H. Edlow
Attorney, Agent, or Firm—H. Christoffersen; D. S. Cohen

[57] ABSTRACT

An electroluminescent semiconductor element is mounted in a housing with an optical fiber extending from the semiconductor element through an opening in the housing and projecting slightly beyond the housing. A plastic material completely surrounds the projecting portion of the optical fiber except for the adjacent end surface of the fiber. The plastic material secures the fiber to the housing, rigidly supports the projecting end portion of the fiber, and seals the opening in the housing through which the fiber extends. The end surface of the fiber is polished to permit emission of light emanating from the semiconductor element.

7 Claims, 1 Drawing Figure

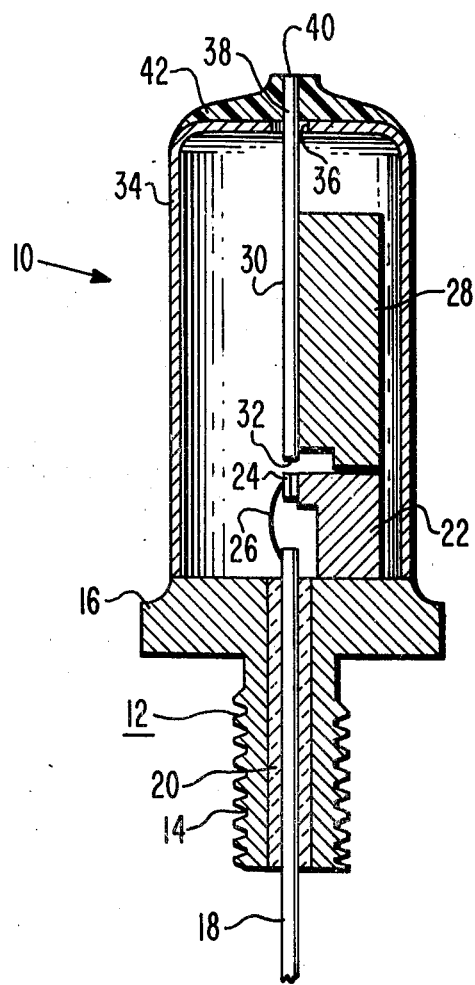

ELECTROLUMINESCENT SEMICONDUCTOR DEVICE HAVING OPTICAL FIBER WINDOW

The present invention relates to an electroluminescent semiconductor device having an optical fiber output and particularly to such a device in which the optical fiber is constructed to act as a window for the light from the semiconductor light emitter.

With the recent development of optical communication systems, electroluminescent semiconductor elements, e.g., light emitting diodes and laser diodes, have come into use as the source of light for these systems. The light emitting semiconductor element is generally mounted in a housing with a length of optical fiber extending from the light emitting surface of the semiconductor element. The optical fiber generally extends through the housing and has a pig-tail several inches long extending from the housing. The pig-tail is used to couple the light from the semiconductor device into the system, such as to a long length of an optical fiber.

There are some applications for the light emitting semiconductor device where it is desirable for the light to be emitted directly from the device. For such applications it is desirable that the optical fiber serve merely as a window through which the light is directly emitted. The relatively long pig-tail on the optical fiber is not suited for this use. Therefore, it would be desirable to have a semiconductor electroluminescent device in which the optical fiber is mounted so that it serves as a window for emitting the light.

The FIGURE of the drawing is a sectional view of one form of a semiconductor electroluminescent device embodying the present invention.

Referring to the drawing, a form of the semiconductor electroluminescent device is generally designated as 10. The electroluminescent device 10 comprises a metal stud 12 having a threaded cylindrical stem 14 and an annular head 16 at one end of the stem 14. A conductive lead wire 18 extends through the stud 12 and is electrically insulated therefrom by a bushing 20 of an electrical insulating material, such as a plastic, glass or ceramic. The bushing 20 preferably also mechanically secures the lead 18 to the stud 12.

Secured to the head 16 of the stud 12 is a diode support 22. The diode support 22 is of a good electrically and thermally conductive material, such as copper. The diode support 22 is either integral with or mechanically secured to the head 16 by a suitable solder or brazing material. Mounted on the diode support 22 is an edge emitting semiconductor electroluminescent element 24. The edge emitting electroluminescent element 24 may be either a semiconductor light emitting diode or laser diode of any well known construction in which the light is emitted from an end surface of the element. For example, the electroluminescent diode element 24 may be of the type disclosed in U.S. Pat. No. 3,974,514, issued to H. Kressel et al., on Aug. 10, 1976. In general, such electroluminescent diode elements include regions of opposite conductivity type forming a PN junction therebetween with the PN junction extending to the light emitting edge surface of the element. The regions of opposite conductivity type extend to opposite surfaces of the element which have metal contacts thereon. One of the contacts is seated on and electrically connected to the diode support 22 and the other contact is electrically connected to the lead 18 by a wire 26. The electroluminescent diode element 24 is mounted on the support 22 with the light emitting end surface facing away from the head 16 of the stud 12.

Secured to the diode support 22 is a metal optical fiber support 28. Mounted on the optical fiber support 28 is a short length of an optical fiber 30. The optical fiber 30 is mounted on the support 28 with one end 32 thereof being adjacent to and in alignment with the light emitting end surface of the electroluminescent diode element 24. The optical fiber is secured to the support 28 by a suitable bonding material, such as an epoxy resin.

A cup-shaped housing 34 surrounds the diode support 22, the electroluminescent diode element 24, the optical fiber support 28 and the optical fiber 30. The edge of the housing 34 at the open end is seated on and secured to the head 16 of the stud 12. The housing 34 is of a metal and may be secured to the head 16 either by a suitable solder, by brazing or by a swaging technique. The optical fiber 30 extends through an opening 36 in the closed end of the housing and has a portion 38 which projects slightly beyond the housing 34. Preferably, the projecting portion 38 of the fiber should be no longer than about 75 mils. Completely surrounding the projecting portion 38 of the wafer 30 except for the adjacent end surface 40 is a body 42 of a plastic material, such as an epoxy resin. The plastic body 42 is secured to the housing 34 and seals the opening 36. In addition, the plastic body 42 rigidly supports the projecting portion 38 of the fiber 30 with respect to the housing 34. The end surface 40 of the optical fiber 30 is optically polished so as to serve as a window for the emission of light from the electroluminescent diode element 24.

To assemble the electroluminescent device 10, an electroluminescent element 24 is mounted on a diode support 22 which is then secured to the head 16 of the stem 12. The wire 26 is then connected between the electroluminescent element 24 and the lead 18. An optical fiber which is longer in length than the optical fiber 30 is mounted on a fiber support 28. The fiber support is then seated against the diode support 22 and moved around until the end surface 32 of the fiber is properly aligned with the light emitting end surface of the electroluminescent element 24 for maximum light coupling. The fiber support 28 is then secured to the diode support 22. The housing 34 is then placed around the electroluminescent element 24, the optical fiber and their supports with the free end of the fiber extending through the opening 36 and the housing 34. The housing 34 is then secured to the head 16 of the stud. The plastic body 42 is then formed around a portion of the optical fiber and the optical fiber is then cut to provide the desired length of the projecting portion 38. The exposed end surface 40 of the optical fiber 30 is then optically polished.

In the electroluminescent device 10 embodying the present invention the short projected end portion 38 of the optical fiber 30 is rigidly held in position so that the optical fiber 30 with the end surface 40 will serve as a window through which the light emitted from the electroluminescent element 24 may exit. The structure of the electroluminescent device 10 provides for ease of assembly with the optical fiber 30 serving as the desired optical output for the device.

I claim:
1. An electroluminescent semiconductor device comprising:
   a housing an electroluminescent semiconductor element mounted in said housing and having a light emitting surface, an optical fiber mounted in said housing, extending through an opening in said housing and having a portion projecting beyond the housing said optical fiber having a pair of end surfaces with one end surface being adjacent the light emitting surface of the electroluminescent element and the other end surface being on the projecting portion of the fiber and adjacent the opening in the housing; and means around the projecting portion of the fiber securing the projecting portion to the housing, said means extending around the entire projecting portion of the fiber except for the adjacent end surface to hold the projecting portion in a rigid position.

2. An electroluminescent semiconductor device in accordance with claim 1 in which the means around the projecting portion of the fiber is a plastic body which also seals the opening in the housing through which the fiber extends.

3. An electroluminescent semiconductor device in accordance with claim 2 in which the end surface of the fiber adjacent the projection portion of the fiber is optically polished.

4. An electroluminescent semiconductor device in accordance with claim 3 including a stud having a cylindrical stem and an annular head at one end of the stem, the housing is a cup-shaped member having its edge at its open end seated on and secured to the head of the stud and the optical fiber extends through an opening in the closed end of the housing.

5. An electroluminescent semiconductor device in accordance with claim 4 in which each of the electroluminescent element and the optical fiber are mounted on separate supports and the supports are mounted in alignment on the head of the stud.

6. An electroluminescent semiconductor device in accordance with claim 5 in which the support for the electroluminescent element is mounted directly on the stud head and the optical fiber support is secured to the support for the electroluminescent element.

7. An electroluminescent semiconductor device in accordance with claim 6 in which the electroluminescent element is mounted with the light emitting structure facing away from the stud head.

* * * * *